United States Patent [19]
Moore

[11] Patent Number: 5,954,912
[45] Date of Patent: Sep. 21, 1999

[54] ROTARY COUPLING

[75] Inventor: Scott E. Moore, Meridian, Id.

[73] Assignee: Micro Technology, Inc., Boise, Id.

[21] Appl. No.: 09/008,144

[22] Filed: Jan. 16, 1998

Related U.S. Application Data

[63] Continuation of application No. 08/724,905, Oct. 3, 1996, Pat. No. 5,747,386.

[51] Int. Cl.⁶ ................................................. H01L 21/00
[52] U.S. Cl. .............................. 156/345; 216/38; 216/88; 438/692
[58] Field of Search .................................... 438/692, 693, 438/747; 216/38, 88, 89; 156/345 LP; 451/41, 288, 388

[56] References Cited

U.S. PATENT DOCUMENTS

| | | | |
|---|---|---|---|
| 4,194,324 | 3/1980 | Bonora et al. ........................ | 51/131.5 |
| 4,716,961 | 1/1988 | Makins, Jr. et al. .................. | 166/68.5 |
| 4,974,370 | 12/1990 | Gosis ..................................... | 51/111 R |
| 5,443,416 | 8/1995 | Volodarsky et al. .................. | 451/388 |
| 5,514,245 | 5/1996 | Doan et al. ............................ | 156/636.1 |
| 5,527,209 | 6/1996 | Volodarskey et al. ................ | 451/388 |
| 5,670,011 | 9/1997 | Togawa et al. ........................ | 156/345 |

*Primary Examiner*—William Powell
*Attorney, Agent, or Firm*—Schwegman, Lundberg, Woessner & Kluth, P.A.

[57] ABSTRACT

A rotary coupling for use in an apparatus for chemical mechanical planarization of material substrates. The coupling has a housing defining a chamber therein. A housing passage is formed through the housing and communicates with the chamber and a fluid source. A rotary shaft is connected at one end to the apparatus and has at an opposite end a coupling end extending into the chamber. A shaft passage is formed longitudinally through the shaft which opens into the coupling end and communicates with the apparatus at its other end. A coupling interface is defined within the chamber of the housing for abutting against the shaft coupling end. The coupling end and coupling interface are biased against one another. The shaft passage and housing passage in combination define a portion of a continuous fluid process line between the apparatus and the fluid source.

18 Claims, 7 Drawing Sheets

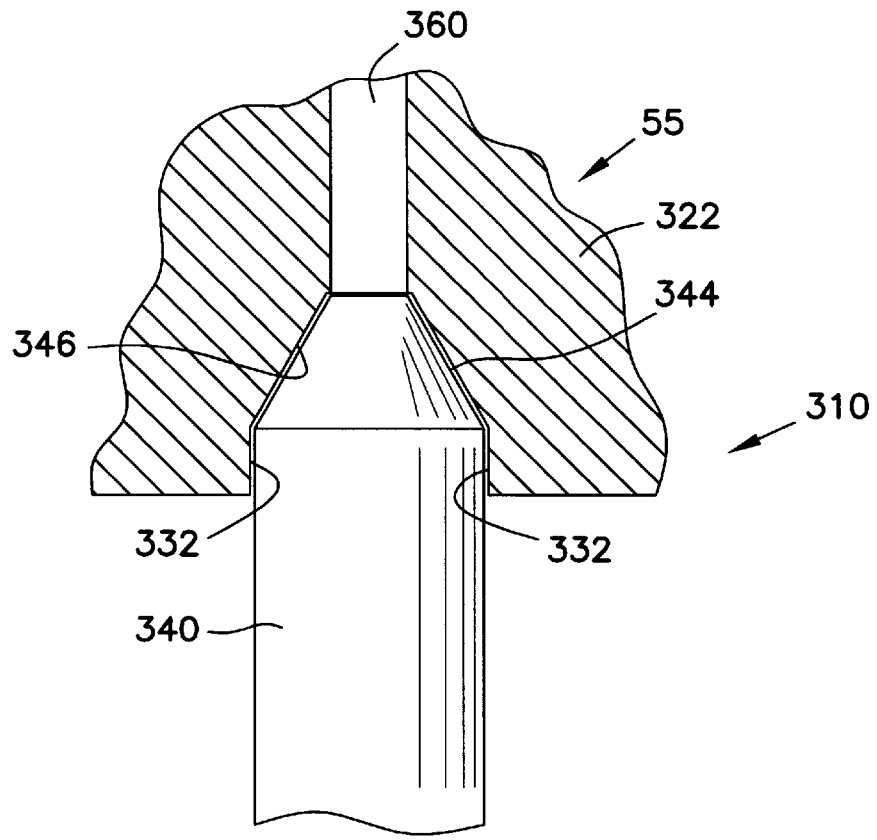
FG. 7
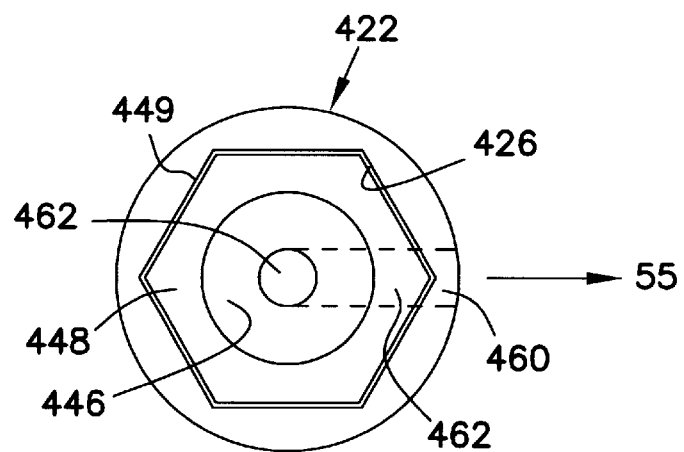
FIG. 8

ROTARY COUPLING

This application is a continuation of application Ser. No. 08/724,905 Oct. 3, 1996 now U.S. Pat. No. 5,747,386

TECHNICAL FIELD OF THE INVENTION

The present invention relates generally to chemical mechanical planarization and in particular the present invention relates to a rotary coupling for a chemical mechanical planarization apparatus.

BACKGROUND OF THE INVENTION

The present technique most commonly used to prepare substrate surfaces such as semiconductor chips or wafers or the like is known as a chemical mechanical planarization or CMP process. The CMP process may be used to polish, flatten, texture, remove films or otherwise prepare such surfaces. The substrate surfaces are polished or otherwise prepared in a machine typically having a rotatable platen which carries a polishing pad on its surface. The machine also typically has a substrate carrier for holding the substrate during the process. The platen pad and carrier are each manufactured having very high precision flatness, particularly for substrates such as wafers. Substrates are mounted to a separate rotatable polishing head or carrier such that the surface to be prepared is exposed and faces the platen pad. A chemical or abrasive slurry applied to the pad is used to prepare the exposed substrate surface as the carrier is brought into contact with the pad. Downward pressure is usually applied between the carrier and the pad to properly carry out the polishing process.

Substrates are typically held from slipping relative to the carrier by a retainer ring abutting the edge of a substrate. The ring may either be fixed or may float laterally relative to the carrier. The retainer ring ensures that the substrates stay attached to the carrier during the process and until it is desired that they be removed. A positively applied pressure may be applied to the back side of the substrates during the preparation process to ensure prepared surface uniformity. An applied vacuum or negative pressure may also be applied through a process line connected to the carrier to aid in holding the substrates to the carrier during loading and unloading from the machine. A substrate backing film is often applied to the carrier for improving adhesion friction, increasing surface uniformity and as a cushion for the substrates during the process. Once the process is completed, it is necessary to remove the substrates from the carrier.

It is essential to avoid inducing unwanted particle or chemical introduction to the process. During the process, the process line often fills with slurry which may eventually be drawn into the machine's equipment over many process cycles. Though a negative pressure may have been used to hold the substrates to the carrier, once the vacuum is released, the substrates may adhere to the carrier by friction between the substrate and carrier or by fluid surface tension caused by excess abrasive fluid caught between the two. To remove the substrates which are adhered to the carrier, it is common to reverse a negative pressure used to hold the substrates in place during unloading and to apply a positive gas or liquid pressure through the same equipment and process line. The positive pressure breaks the adhesion force between the substrates and carrier.

When the next substrates are to be polished, the pressure in the equipment is again reversed. Any fluids including the wet slurry remaining within the polishing chamber may be drawn into the process line upon negative pressurization of the line. This cycling of the equipment between a positive and negative pressure causes problems. A conventional polishing machine utilizes different fluids for different steps of the process, each of which is delivered and withdrawn through the same lines. Some of the fluids may cause problems as well.

Fluid source equipment is typically disposed remote from the carrier within the polishing machine and coupled to the carrier via a rotary coupling. Conventional rotary couplings connect the rotating shaft of the carrier to the fluid source and include a stationary component coupled to the shaft. The coupling also has a housing with void space between a fluid source line and the carrier fluid process line.

Abrasive or corrosive chemical slurry often is drawn into the process line and enters the coupling becoming trapped in the void space. The slurry gets trapped between the rotating shaft and the shaft bearings, the shaft seals, or the stationary component of the coupling. This causes premature wear, damage and eventually total destruction of the couplings. This also induces deterioration of the coupling components causing particle generation and coupling leakage. Particles may find there way back into the machine and damage substrates during the process. These problems result in high down time for the machine and necessitates frequent maintenance. Though the CMP process has been significantly improved in recent years, little improvements have been made to the machine components.

For the reasons stated above, and for other reasons stated below which will become apparent to those skilled in the art upon reading and understanding the present specification, there is a need in the art for an improved rotary coupling for a substrate finishing machine which is more durable and reliable than conventional rotary couplings.

SUMMARY OF THE INVENTION

The above-mentioned problems with present rotary coupling technology and other problems are addressed by the present invention and which will be understood by reading and studying the following specification. A rotary coupling having improved reliability and durability characteristics is described which is useful in the process of flattening, polishing, texturing, removing films or otherwise preparing substrate surfaces such as semiconductor wafers and the like.

In particular, one embodiment of the present invention describes a rotary coupling used in conjunction with a wafer polishing machine of the chemical mechanical planarization or CMP type. The rotary coupling includes a housing defining a chamber therein and a housing passage formed through the housing communicating with the chamber and a fluid source. A rotary shaft is connected at one end to the polishing machine and has a coupling end which extends into the chamber. A shaft passage extends through the shaft and opens into the coupling end of the shaft.

A coupling head is disposed in the chamber and is biased against the coupling end of the shaft The coupling head has a head passage formed therethrough which at one end aligns with the shaft passage and at its opposite end aligns with the housing passage. The shaft passage, head passage, and housing passage combine to define a continuous fluid flow path or process line through the rotary coupling.

The invention eliminates fluid void space or pockets within the coupling where abrasive or other harmful fluids may collect or pool up. The invention prevents contaminants such as abrasive fluid from getting between the rotating and stationary components of the coupling which would otherwise cause premature wear or damage. The invention also provides a seal which improves as the mating components wear relative to one another. Thus, the rotary coupling of the invention is a more durable and reliable coupling for use in conjunction with CMP process and other substrate finishing machines.

BRIEF DESCRIPTION OF THE DRAWINGS

FIG. 7 is a partial side view in cross section of an alternative embodiment of a rotary coupling housing and rotary shaft;

FIG. 8 is a partial bottom plan view of an alternative embodiment of a rotary coupling housing, rotary shaft and coupling head;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
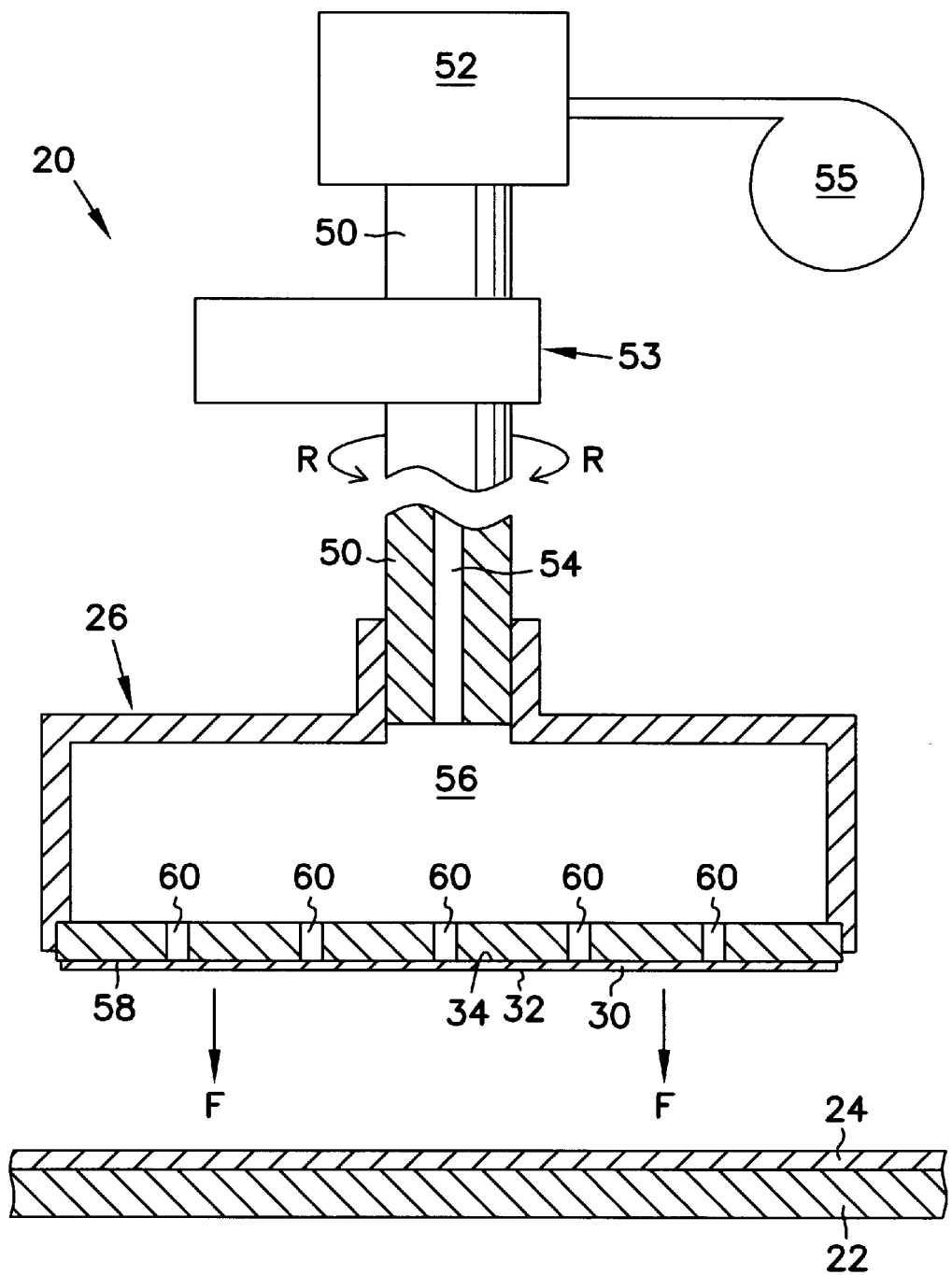
FIG. 1 is a fragmentary sectional view of a typical substrate finishing apparatus and carrier incorporating a rotary coupling.

Referring now to the drawings, FIG. 1 illustrates a simplified depiction of the basic components associated with a conventional semiconductor wafer polishing apparatus 20, adaptable for use during a typical CMP process. The apparatus 20 has mounted on its top surface (not shown) a rotatable platen 22 which supports a polishing pad 24 on its upper surface. A wet abrasive or chemical slurry is typically dispensed on the pad. A plurality of removable wafer polishing heads or carriers 26 are rotatably supported by a part of apparatus 20 such as a cover or support arm (not shown) above the polishing pad. Carriers 26 each carry thereon one or more wafers 30 in a manner having an exposed wafer surface 32 confronting polishing pad 24 so that when a carrier 26 is lowered during the polishing process, each exposed wafer surface will contact the polishing pad.

It is common during the CMP process for wafers 30 to be held by carriers 26 via a vacuum or negative pressure applied from within the carrier to a back surface 34 of the wafers. FIG. 1 illustrates a simplified wafer carrier 26 with a wafer 30 adhered thereto in a partial fragmentary sectional view. Carrier 26 typically has a rotary shaft 50 with one end received in a rotary coupling 52 to which the present invention is directed. The shaft may pass through a gear box 53 (shown only in schematic form) which is mechanically driven by a drive system (not shown) for applying the desired speed and direction "R" and for applying the downward polishing force "F" to the carrier. Coupling 52 and gear box 53 also act as support bearings for the rotary shaft 50. The shaft 50 may also be driven by a direct drive, high torque, low speed motor (not shown) which may require no intermediate gearbox 53.

A process line 54 extends through shaft 50 between rotary carrier 26 and a stationary fluid source 55 (shown only in schematic form). The carrier and fluid source are fluidly coupled to one another via process line 54 and rotary coupling 52. Carrier 26 includes a fluid chamber 56 which communicates with process line 54 and distributes fluid across substantially the entire bottom surface area or underside 58 of the carrier. Fluid chamber 56 communicates with underside 58 of carrier 26 through a plurality of fluid ports 60 formed through the carrier between chamber 56 and underside 58.

As will be evident to those skilled in the art, carrier 26 and polishing apparatus 20 may take on any number of configurations and constructions without departing from the scope of the present invention. FIG. 1 illustrating the apparatus and carrier has been included merely to show the environment in which a rotary coupling of the present invention may be used and to aid in clearly describing the invention. Carrier 26 and apparatus 20 have been illustrated in simplified form herein to also avoid descriptive detail not necessary in understanding the present invention.

A conventional carrier 26 rotates with rotary shaft 50 when wafer 30 is in contact with polishing pad 24 to polish the exposed surface 32 of the wafer. Rotary coupling 52 is connected to fluid source 55, typically housed within cover 28 of apparatus 20, for selectively delivering and withdrawing fluid to and from carrier 26. Fluid source 55 may be adapted to selectively utilize a number of different fluids, such as water, air, or other gases or liquids as desired, to accomplish the various steps of the CMP process. Rotary coupling 52 is intended to provide a fluid coupling between the rotating carrier 26 and the stationary fluid source 55 and is preferably reliable, durable and does not leak when in use.

To retain wafer 30 against underside 58 of carrier 26 prior to and sometimes during the process, a negative fluid pressure or vacuum is applied by fluid source 55 to fluid chamber 56. The negative pressure within fluid chamber 56 applies a suction force against back surface 34 of wafer 30 through fluid ports 60 to retain the wafer against underside 58 of the carrier. During the process, the downward force "F" is applied which retains the wafer between pad 24 and carrier. A reverse or positive pressure is sometimes applied through process line 54 during the process to the back surface 34 of wafer 30 for producing a more uniform polished surface. The positive pressure is transmitted through fluid ports 60 and applied to each wafer back surface 34. Upon completion of the polishing process, it is necessary to eject wafer 30 from carrier 26 preferably without contacting the wafer to avoid contaminating either side of the wafer. This is accomplished by again applying a positive pressure to back surface 34 of the wafer, forcing the wafer away from underside 58 of the carrier. Fluid source 55 is controllable to reverse the applied pressure in process line 54 between a positive and negative pressure within fluid chamber 56.

During the polishing process and pressure cycling between positive and negative pressure, excess wet abrasive or chemical slurry or other contaminants may be drawn into fluid chamber 56 and process line 54 through fluid ports 60. As the coupling itself sears or disintegrates, material particles are generated which add to contamination of the coupling. The contaminants within the process line are drawn into rotary coupling 52 causing damage to the various components of the coupling.

Figure 2:
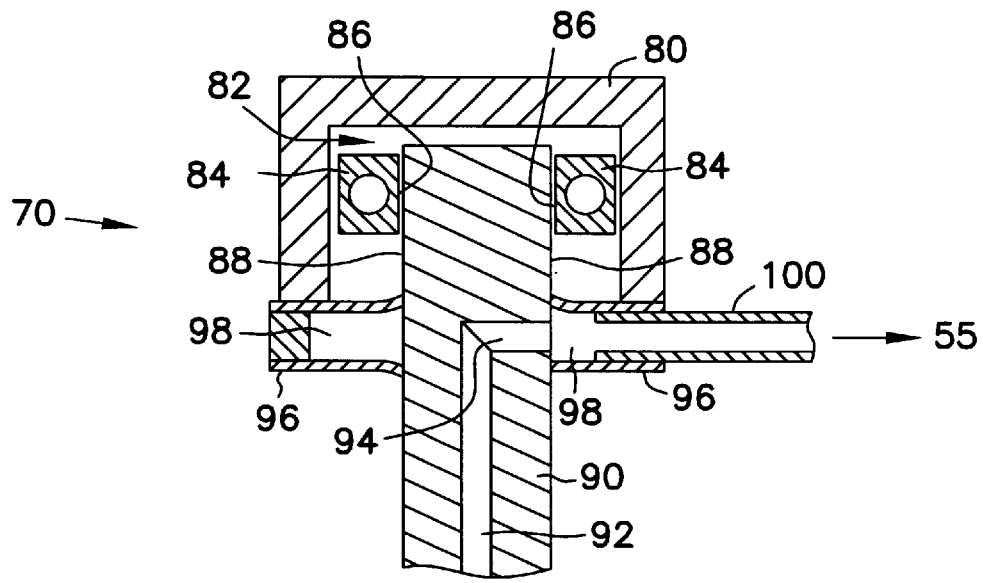
FIG. 2 is a side view in cross section of a prior art rotary coupling.

FIG. 2 illustrates a cross section of a typical prior art rotary coupling 70 which corresponds to rotary coupling 52 in FIG. 1. Prior art rotary coupling 70 includes a housing or cap 80 having a cavity 82 formed therein. A conventional sliding friction bearing 84 is received within cavity 82 which has a shaft interface 86 in contact with the external surface 88 of a prior art rotary shaft 90. Rotary shaft 90 includes a longitudinal passage 92 extending axially along shaft 90 which communicates at one end with a radial passage 94 which opens to external surface 88 of shaft 90. An annular lip seal 96 is received around shaft 90 over radial passage 94 defining an annular fluid space 98 around the shaft into which the radial passage opens.

A tube or fluid source passage 100 communicates with fluid space 98 for transferring fluid between fluid source 55 and wafer carrier 26 (not shown in FIG. 2) through longitudinal passage 92 and radial passage 94. Any abrasive slurry or other contaminant which is drawn from a carrier into longitudinal passage 92 collects in fluid space 98. Lip seal 96 is stationary relative to rotary shaft 90 producing sliding surface friction between the two components. Any abrasive slurry or other contaminant which ends up between shaft 90 and lip seal 96 causes premature and excessive wear to both of the components and may also escape into cavity 82 of cap 80 and cause damage to bearing 84 in a similar manner.

Figure 3:
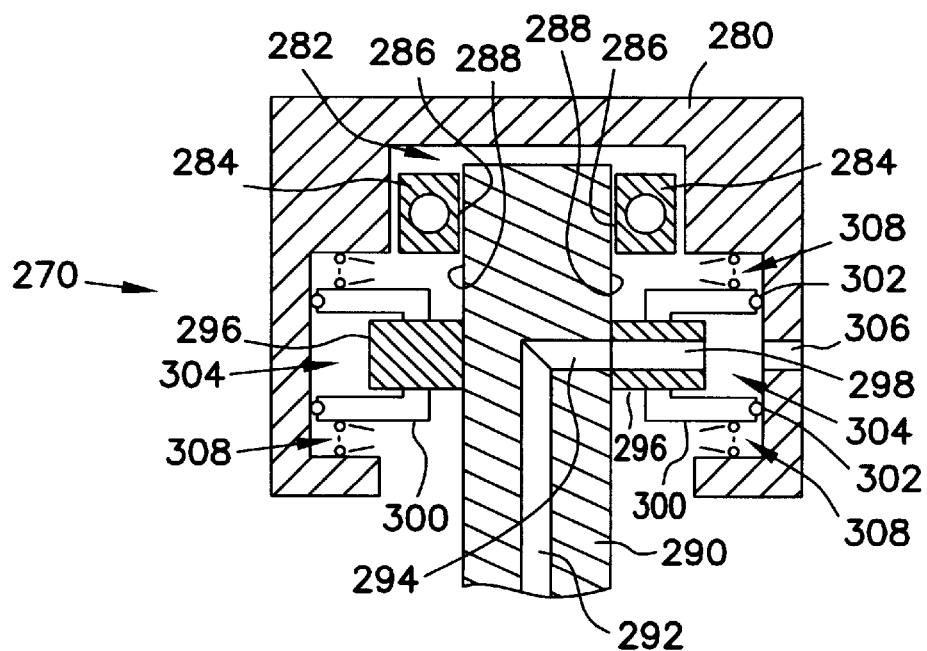
FIG. 3 is a side view in cross section of another prior art rotary coupling.

FIG. 3 illustrates a cross section of another prior art rotary coupling incorporating a face type seal. Prior art coupling 270 includes a housing 280 defining a cavity 282 therein. A conventional bearing 284 is received in the upper portion of cavity 282 and has a shaft interface 286 in contact with the external surface 288 of a rotary shaft 290. Rotary shaft 290 includes a longitudinal passage 292 communicating at one end with a radial passage 294 which opens to external surface 288. A rotating seal plate 296 is received on shaft 290 and rotates therewith. Seal plate 296 includes a fluid port 298 concentrically aligned for fluid communication with radial passage 294 of the shaft.

A pair of fixed seal plates 300 are received within cavity 282 abutting opposite sides of rotary seal plate 296. Each fixed seal plate 300 includes an annular edge having thereon an O-ring seal 302 abutting against housing 280 within cavity 282. A fluid space 304 is defined between fixed seal plates 300, housing 280 and rotary seal plate 296. Fluid port 298 communicates with fluid space 304 which in turn communicates with a fluid source passage 306 in housing 280. Passage 306 transfers fluid to and from a fluid source 55 as does the passage 100 in the embodiment of FIG. 2. A pair of annular compression springs 308 are received within cavity 282 for biasing fixed seal plates 300 towards and into contact with the opposite edges of rotary seal plate 296. The face type seal coupling 270 includes the void or fluid space 304 similar to coupling 70 causing the same problems as those noted above.

Figure 4:
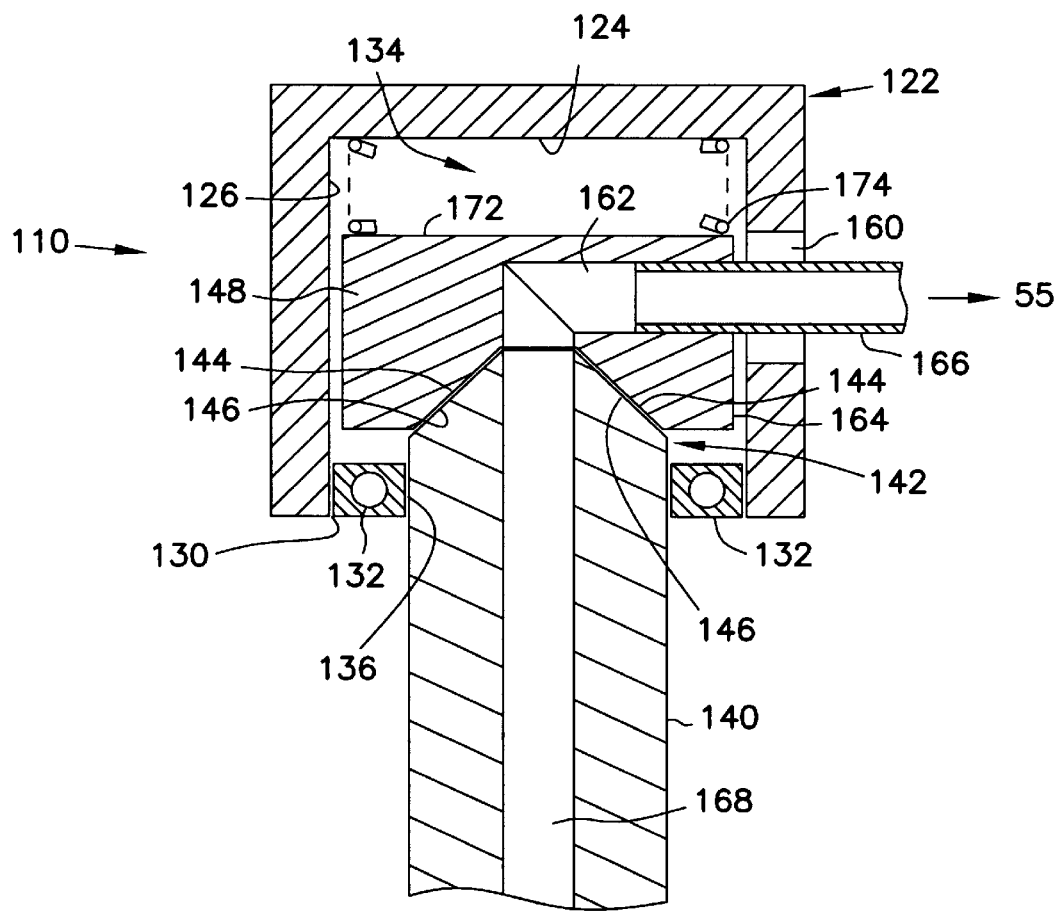
FIG. 4 is a side view in cross section of a rotary coupling constructed in accordance with one embodiment of the present invention.

FIG. 4 illustrates an improved rotary coupling 110 constructed in accordance with one embodiment of the present invention. Rotary coupling 110 corresponds to coupling 52 of FIG. 1 and replaces prior art couplings 70 and 270. The rotary couplings of the invention eliminate the void spaces or pockets where excess fluids and contaminants would otherwise pool up within the coupling.

Rotary coupling 110 includes a housing 122 having an end closure 124 adjoined to one end of an annular side wall 126. Housing 122 is in the form of a cap in the present embodiment but may take on any number of constructions and configurations without departing from the scope of the present invention as will be evident to those skilled in the art. The housing may be integrally formed as part of fluid source 55 as described below and illustrated in FIG. 5.

Annular side wall 126 of housing 122 defines an open end 130 opposite end closure 124. A conventional sliding friction bearing 132 is received within open end 130 and together with end closure 124 and annular side wall 126 defines a coupling chamber 134 within housing 122. Bearing 132 includes an annular shaft interface 136 for receiving therethrough a rotary shaft 140 constructed in accordance with one embodiment of the present invention. Rotary shaft 140 includes a coupling end 142 extending through bearing interface 136 into chamber 134. Coupling end 142 includes a conically tapered tip 144 projecting into chamber 134 which is received in a coupling interface provided within the housing. In the present embodiment, the coupling interface is a corresponding tapered blind bore 146 in a floating coupling head 148 disposed within chamber 134. Coupling head 148 is in the form of a disk or puck but as will be evident to those skilled in the art may vary in construction and configuration without departing from the scope of the invention.

Figure 5:
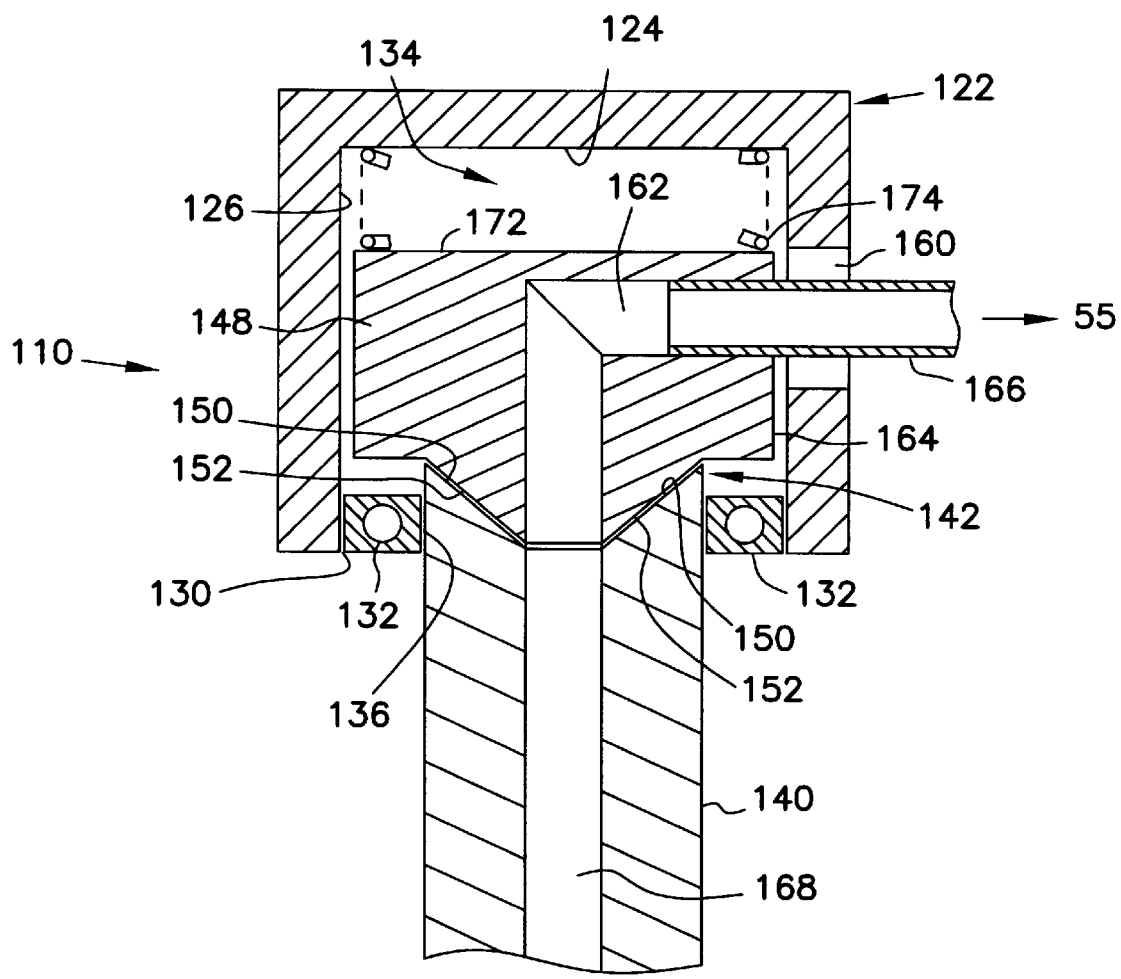
FIG. 5 is a partial side view in cross section of an alternative embodiment of a rotary coupling shaft and coupling head.
Figure 6:
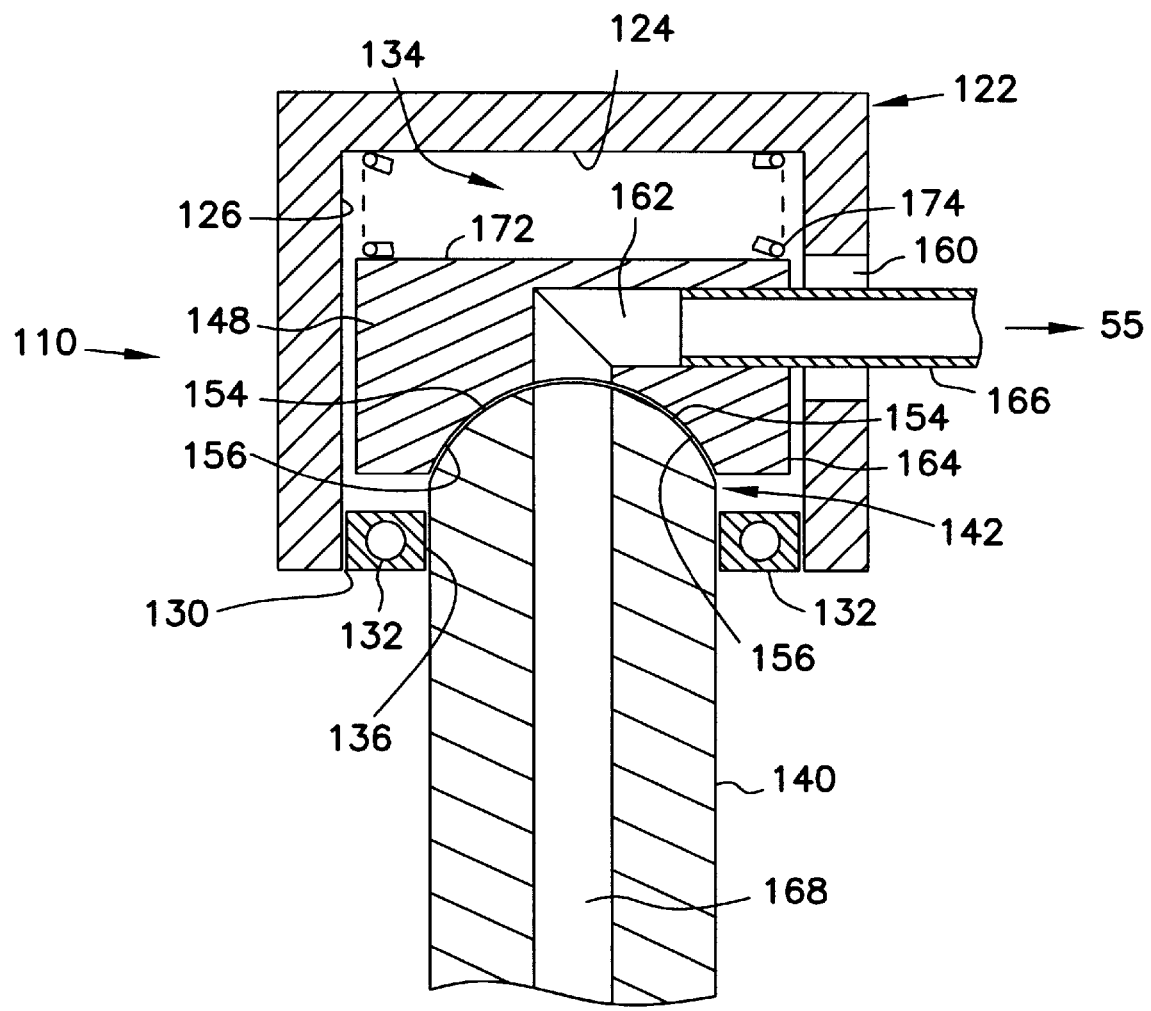
FIG. 6 is a partial side view in cross section of an alternative embodiment of a rotary coupling head and rotary shaft.

FIGS. 5 and 6 illustrate alternative embodiments for the coupling end of the rotary shaft and the corresponding coupling head interface defined by conically tapered tip 144 and tapered blind bore 146 above. FIG. 5 illustrates a reverse configuration where the coupling end of the shaft includes a tapered recess 150 and the coupling head includes a corresponding conical projection 152 as the coupling interlace. FIG. 6 shows a ball and socket configuration wherein the coupling end of the rotary shaft includes a rounded ball end 154 and the coupling head includes a corresponding rounded socket 156 formed therein. The ball and socket configuration may be reversed similar to the conical configuration. Other constructions and configurations may be used as will be evident to those skilled in the art.

Shaft 140 of coupling 110 rotates with conical taper 144 bearing against stationary tapered bore 146 of coupling head 148. Either coupling end 142, coupling head 148 or preferably both are constructed from a material providing high surface durability and wear characteristics and low surface friction. FIG. 7 illustrates an alternative embodiment of a rotary coupling 310 wherein a housing 322 is integrally formed as part of fluid source 55. A coupling interface in the form of a tapered blind bore 346 is provided directly in housing 322 and bears against a conical taper 344 of a rotary shaft 340. Housing 322 includes a housing passage 360 communicating directly with fluid source 55. A conventional sleeve bearing 332 is disposed between rotary shaft 340 and housing 322 to provide a low friction and high wear surface between the two components.

Housing 122 of the coupling in FIG. 4 includes a housing passage 160 formed therethrough which communicates at one end with a head passage 162 formed within floating coupling head 148 and at its other end communicates with fluid source 55. In the present embodiment, head passage 162 terminates at one end in the bottom of tapered blind bore 146 and at its other end on an outer annular surface 164 of coupling head 148.

To retain housing passage 160 and head passage 162 in alignment, an antirotation mechanism is used to rotationally lock floating coupling head 148 relative to housing 122. In the present embodiment, the anti-rotation mechanism is a hollow tube 166 inserted partway into housing passage 160 and extending into chamber 134 so that a portion of the hollow tube may be received in head passage 162 of coupling head 148. Anti-rotation device 166 therefore provides both the anti-rotation feature and a fluid path connection between housing passage 160 and head passage 162. As illustrated in FIG. 4, housing passage 160 is a vertically oriented slot permitting tube 166 to move vertically along with coupling head 148 relative to housing 122.

As will be evident to those skilled in the art, the anti-rotation device may take on any number of constructions and configurations without departing from the scope of the present invention and may easily be provided as a key and slot distinct from the fluid flow passages of the rotary coupling. FIG. 8 illustrates a cross section of an alternative embodiment of a coupling head and housing wherein the anti-rotation feature is inherently provided by the component configuration. A housing 422 defines a coupling head pocket with an interior annular side wall 426 of a hexagonal or noncircular cross section. A coupling head 448 is received therein and has an exterior annular surface 449 of a size and shape corresponding to that of annular side wall 426. A housing passage 460 is provided in housing 422 which communicates with a head passage 462 in coupling head 448. A coupling interface or tapered bore 346 is included for receiving therein a rotary shaft coupling end (not shown). The non-circular configuration prevents the coupling head from rotating relative to the housing for maintaining alignment between housing passage 460 and head passage 462.

Referring again to the embodiment of FIG. 4, rotary shaft 140 includes a shaft passage 168 formed axially or longitudinally along the shaft which terminates at and opens into the tip of conical taper 144. Shaft passage 168 aligns with head passage 162 at the bottom of tapered blind bore 146 in coupling head 148 when conical taper 144 is fully seated in tapered blind bore 146. Shaft passage 168, head passage 162 and housing passage 160 combine to define process line 54 as illustrated in FIG. 1 for passing fluid between carrier 26 and fluid source 55.

Conical taper 144 at coupling end 142 of rotary shaft 140 must precisely correspond in contour to tapered blind bore 146 to prevent fluid flowing between shaft passage 168 and head passage 162 from leaking between the two components. Coupling head 148 and coupling end 142 of rotary shaft 140 must remain in contact with one another as the rotary shaft rotates to ensure no leakage occurs. A biasing means such as a compression spring 174 illustrated in FIG. 4 is disposed between closure end 124 of housing 122 and a top surface 172 of coupling head 148. Compression spring 174 is trapped between stationary closure end 124 and top surface 172 of floating coupling head 148 within chamber 134 to force the coupling head against coupling end 142 of rotary shaft 140. It is preferred that anti-rotation device or tube 166 is flexible or otherwise permits some vertical movement of coupling head 148 so it may float vertically within chamber 134 which will be evident to those skilled in the art. In the embodiment of FIG. 4, housing passage 160 is vertically slotted to permit such movement.

The biasing means for forcing the coupling head and rotary shaft into contact with one another may include means other than the compression spring 174 described above. A pressure chamber may be provided above the coupling head or an evacuated chamber below the coupling head may be provided to bias the coupling head against the shaft coupling end. The amount of pressure or vacuum applied to the chamber may be controlled or manipulated as needed. The pressure or vacuum may be increased during the polishing process and decreased during idling periods to further reduce component wear within the coupling.

The rotary couplings constructed in accordance with the present invention eliminates the-fluid space or pocket 98 and 304 of the prior art couplings illustrated in FIGS. 2 and 3, respectively. Any wet slurry or other contaminant which is drawn into rotary coupling 110, for example, through longitudinal passage 168 will pass directly through the coupling back to fluid source 55 or be returned to carrier 26. The abrasive or harmful fluid and other contaminants are prevented from pooling up within the coupling and eventually leaking between coupling head 148 and coupling end 142 of rotary shaft 140 so that damage to the components does not occur. Contaminants are further prevented from flowing down rotary shaft 140 between bearing interface 136 and the shaft so that damage does not occur to these components as hi the prior art coupling.

Figure 9:
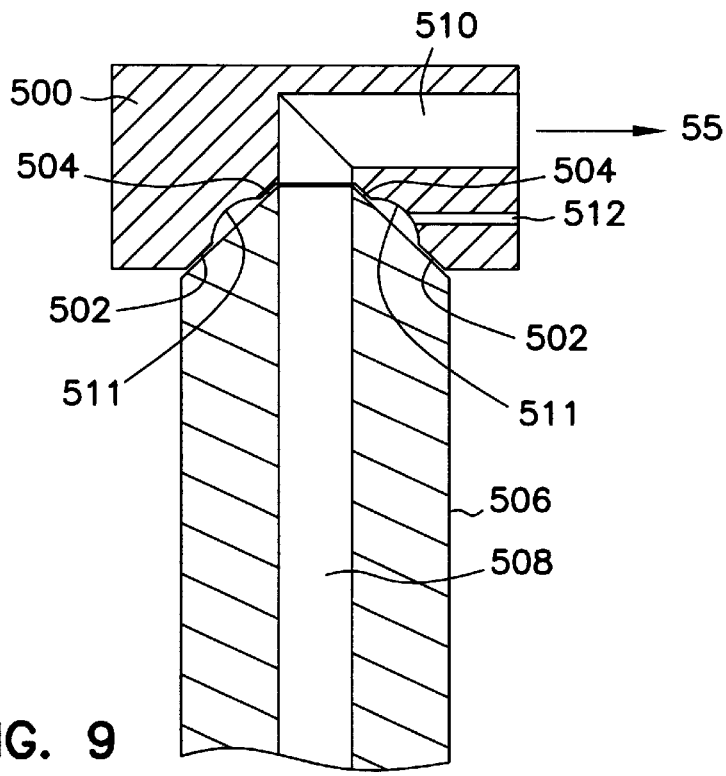
FIG. 9 is a partial side view in cross section of an alternative embodiment of a rotary coupling including additional ports.

The rotary coupling of the invention may include additional ports, other than the process port, as illustrated in FIG. 9. A coupling head 500 (or housing as in FIG. 7) has a tapered bore coupling interface 502 for receiving therein a tapered end 504 of a rotary shaft 506. Shaft 506 has a longitudinal passage 508 communicating with a head passage 510 which in combination define a section of a process port communicating with a fluid source 55. Tapered bore 502 includes an annular groove 511 formed therein which communicates with a secondary port 512 formed in the coupling head independent of the process port.

Secondary port 512 may be included as a scavenging port for providing a leak path for fluid escaping between shaft 506 and head 500. Port 512 may communicate with the fluid source 55 or a fluid purge system (not shown) as desired. The port may additionally be provided as a leak detection port and include electronics to sense when a leak has occurred. Alternatively, port 512 may be utilized as a pressure balance or backing port to reduce or control the fluid pressure differential across the process line as desired. As will be evident to those in the art, more than one secondary process port 512 may be utilized as well.

Figure 10:
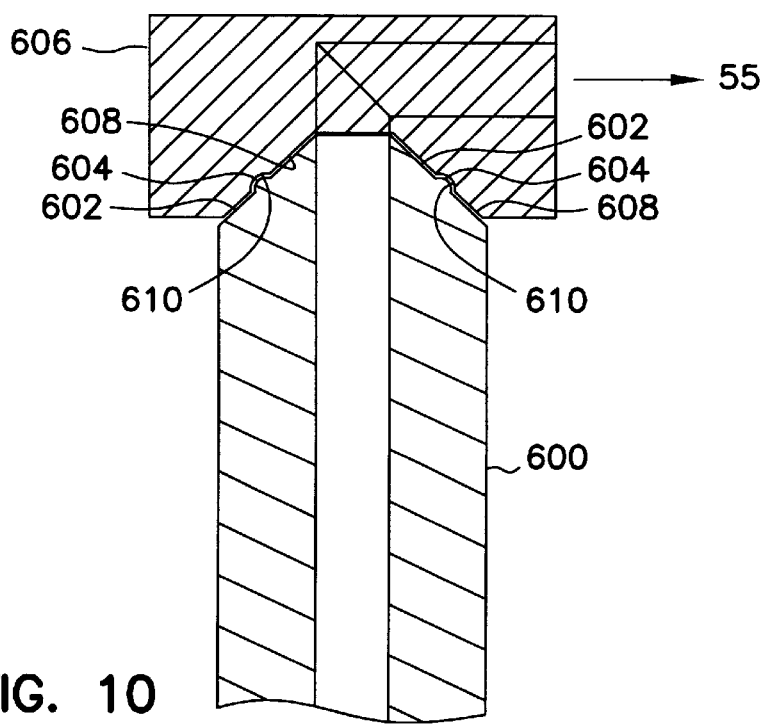
FIG. 10 is a partial side view in cross section of an alternative embodiment of a rotary coupling head and rotary shaft incorporating mating alignment and seal rings.

FIG. 10 illustrates another alternative embodiment of the invention incorporating an alignment and leak prevention feature. A rotary shaft 600 includes a tapered coupling end 602 having formed thereon one or more projecting annular rings 604 disposed along the tapered surface. A coupling head 606 (or housing as in FIG. 7) includes a corresponding tapered bore coupling interface 608 for receiving therein the tapered end of shaft 600. The tapered bore further includes one or more annular grooves 610 formed therein which correspond to each of the one or more rings 604. Each ring 604 is received in its corresponding groove 610 which helps register and axially align the shaft with the coupling head. The rings and grooves also provide an additional barrier to leakage of fluid between tapered end 602 and tapered bore 608.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A rotary coupling for a chemical mechanical planarization apparatus, said rotary coupling comprising:
    a housing having a chamber therein;
    a housing passage formed through the housing, the housing passage communicating with a fluid source at a first end and the chamber at a second end;
    a rotary shaft for coupling with the chemical mechanical planarization apparatus, the rotary shaft having a coupling end extending into the chamber of said housing;
    a shaft passage formed through the rotary shaft and opening into the coupling end, the shaft passage being in communication with the housing passage; and
    a coupling head defining a coupling interface within the chamber, the coupling head disposed against the rotary shaft such that the coupling interface contacts the coupling end of the rotary shaft.

2. The rotary coupling of claim 1, wherein the coupling head comprises a floating coupling head.

3. The rotary coupling of claim 1, wherein the coupling head is biased against the rotary shaft.

4. The rotary coupling of claim 1, wherein the coupling head comprises a conical projection received by a corresponding tapered recess of the coupling end of the rotary shaft.

5. The rotary coupling of claim 1, wherein the coupling head comprises a rounded socket formed therein, and the coupling end of the rotary shaft comprises a rounded ball received by the rounded socket of the coupling head.

6. The rotary coupling of claim 1, further comprising a means for preventing the coupling head from rotating relative to the housing.

7. The rotary coupling of claim 6, wherein the means for preventing the coupling head from rotating relative to the housing has a fluid path associated therewith, where the fluid path communicates with the fluid source.

8. The rotary coupling of claim 6, wherein the means for preventing the coupling head from rotating relative to the housing comprises the housing defining a coupling head pocket having a non-circular interior annular side wall, and the coupling head received within the head pocket has an exterior annular surface corresponding to the annular side wall.

9. The rotary coupling of claim 8, wherein the head pocket has a hexagonal cross section.

10. The rotary coupling of claims 1, further comprising at least one projecting anular ring disposed on the tapered surface of the coupling end, and the tapered bore having a corresponding at least one annular groove formed therein, wherein the annular ring of the coupling end is received by the annular groove.

11. The rotary coupling of claim 3, further comprising a compression spring disposed between said housing and said coupling head.

12. The rotary coupling of claim 1, further comprising at least one secondary fluid port through said housing, and wherein the tapered bore has an annular groove formed therein communicatively coupled with the secondary fluid port.

13. A wafer polishing apparatus comprising:
    a wafer carrier having a plurality of fluid ports formed therethrough, the carrier being fluidly coupled to a fluid source;
    a rotary coupling comprising:
        a housing having a chamber therein;
        a housing passage formed through the housing, the housing passage opening into the chamber at a first end and communicating at a second end with the fluid source;
        a rotary shaft for coupling with the carrier and the chemical mechanical planarization apparatus, the rotary shaft having a coupling end for coupling with the chamber and a shaft passage formed therethrough, the shaft passage being communicatively coupled with the carrier; and
        a coupling head received within said chamber having a head passage formed therethrough communicating at one end with the shaft passage and at an opposite end with the housing passage, and having a coupling interface biased against the coupling end of the rotary shaft;
        wherein the shaft passage, the head passage and the housing passage in combination define at least a portion of a continuous fluid process line through the rotary coupling between the apparatus and the fluid source.

14. The wafer polishing apparatus as recited in claim 13, further comprising a means for retaining a wafer to the carrier.

15. A method of delivering fluid from a remote, non-rotary fluid source to a rotary component of an apparatus, said method comprising:
    forming a housing passage within a housing and in communication with a chamber and the fluid source;
    inserting a coupling head within the chamber, the coupling head having a coupling interface;
    forming a longitudinal shaft passage though a rotary shaft;
    inserting a coupling end of the rotary shaft into the chamber such that the rotary shaft passage communicates with the housing passage; and
    contacting a coupling end of the rotary shaft with the coupling interface of the coupling head such that the shaft passage and the housing passage in combination define at least a portion of a continuous fluid process line between the apparatus and the fluid source.

16. The method of claim 15, wherein the step of contacting the coupling end with the coupling interface comprises biasing the coupling end of the rotary shaft against the coupling interface of the coupling head.

17. The method of claim 15, further comprising the step of forming a head passage through the coupling head and in communication with the shaft passage for defining at least a portion of the continuous fluid process line.

18. The method of claim 15, further comprising the step of preventing the coupling head from rotating relative to the housing.

* * * * *